United States Patent
Chao et al.

(10) Patent No.: US 6,297,670 B1
(45) Date of Patent: Oct. 2, 2001

(54) SINGLE-ENDED SENSE AMPLIFIER WITH ADJUSTABLE NOISE MARGIN AND POWER DOWN CONTROL

(75) Inventors: Chin-Chieh Chao; Tsen-Shau Yang; Keh-Yung Tso, all of Hsinchu (TW)

(73) Assignee: Century Semiconductor, Inc., Hsinchu (TW)

( * ) Notice: Subject to any disclaimer, the term of this patent is extended or adjusted under 35 U.S.C. 154(b) by 0 days.

(21) Appl. No.: 09/538,912

(22) Filed: Mar. 30, 2000

(51) Int. Cl.[7] ............... G01R 19/00; G11C 7/00; H03F 3/45
(52) U.S. Cl. ............... 327/51; 327/67; 365/203
(58) Field of Search ............... 327/50, 51, 57, 327/56, 67, 205, 206, 143, 309, 54, 70; 365/203

(56) References Cited

U.S. PATENT DOCUMENTS

| | | | |
|---|---|---|---|
| 5,495,191 | * | 2/1996 | Lev et al. ............... 327/51 |
| 5,619,149 | * | 4/1997 | Lev et al. ............... 327/51 |
| 5,689,200 | * | 11/1997 | Ting et al. ............... 327/50 |
| 5,748,015 | * | 5/1998 | Tam ............... 327/51 |
| 5,909,394 | * | 6/1999 | Chou ............... 327/51 |

* cited by examiner

Primary Examiner—Terry D. Cunningham
Assistant Examiner—Long Nguyen
(74) Attorney, Agent, or Firm—Darby & Darby

(57) ABSTRACT

The present invention discloses a single-ended sense amplifier including an output circuit having an output terminal for indicating a state of a bitline node. In addition, a noise margin circuit; and an n-channel transistor are provided for coupling or decoupling an input terminal of the output circuit with the bitline node. The variable logic-threshold inverter has a larger logic threshold voltage in response to a lower voltage level of a precharge signal and a smaller logic-threshold voltage in response to a higher voltage level of the precharge signal. The difference between the two logic-threshold voltages represents the possible noise margin. Furthermore, a power down control circuit is provided to be coupled to the bitline node for reducing the static power consumption of the single-ended sense amplifier. The single-ended sense amplifier according to the present invention provides a higher and adjustable noise margin and occupies a smaller area on a semiconductor wafer.

7 Claims, 4 Drawing Sheets

US 6,297,670 B1

SINGLE-ENDED SENSE AMPLIFIER WITH ADJUSTABLE NOISE MARGIN AND POWER DOWN CONTROL

FIELD OF THE INVENTION

The present invention relates to a single-ended sense amplifier for sensing a state of a bitline in a read-only memory or a register file. More particularly, the present invention relates to a single-ended sense amplifier with a noise margin circuit for providing an adjustable noise margin and a power down control circuit for reducing static power dissipation.

BACKGROUND OF THE INVENTION

A single-ended sense amplifier is typically designed to sense a state of a bitline in a read-only memory or a register file. For example, the read-only memory usually includes a plurality of memory cells arranged in a form of matrix. Each memory cell is coupled to a wordline node and a bitline node, respectively. If the memory cell contains a transistor, the voltage of the bitline node drops toward ground when an input voltage is applied to the wordline node to turn on the transistor.

A conventional sense amplifier for indicating the change of the voltage at the bitline node is shown in FIG. 1. Referring to FIG. 1, the conventional sense amplifier includes an output circuit 1, a precharge circuit 2, and a discharge circuit 3. The output circuit 1 has a data node 4 as the input terminal. The data node 4 is coupled to the precharge circuit 2 and the discharge circuit 3.

The discharge circuit 3 includes an n-channel transistor M6 and an inverter INV0. The inverter INV0 has its input coupled to the bitline node 5 and its output coupled to the gate electrode of the n-channel transistor M6 at the reference node NR. Therefore, the decrease in the voltage level of the bitline node 5 results in the rapid increase of the gate-source voltage of the n-channel transistor M6.

For the output circuit 1, an inverter INV1 senses the state of the data node 4. If the voltage of the data node 4 drops below a threshold voltage for the inverter INV1, the inverter INV1 outputs a logic high. If the voltage of the data node 4 remains above the threshold voltage, the inverter INV1 outputs a logic low. This logic low level turns a p-channel transistor M7 on such that the voltage of the data node 4 remains at or near an external constant voltage source Vcc. In addition, an inverter INV2 is coupled to receive the output of the inverter INV1, and then generates inverted signal as the output voltage $V_{out}$.

The precharge circuit 2 includes a p-channel transistor M5 having a source electrode connected to the external constant voltage source Vcc, a drain electrode coupled to the data node 4, and a gate electrode for receiving a precharge signal 6.

The conventional sense amplifier has two modes of operation: precharge and sense modes. During the precharge mode, the precharge signal 6 is low such that the p-channel transistor M5 is turned on. The bitline node 5 is precharged toward an intermediate voltage level between ground and Vcc through the transistors M5 and M6 until the n-channel transistor M6 is turned off. On the other hand, when the precharge signal 6 is high, the sense amplifier is operated in the sense mode with the non-conductive p-channel transistor M5. If the bitline node 5 is pulled low slightly, the voltage level at the reference node NR will move higher, turning on the n-channel transistor M6. As the bitline node 5 is pulled further down, the n-channel transistor M6 is turned on harder and pulls the voltage of the data node 4 low. Since the n-channel If transistor M6 is biased at the edge of conduction after the precharge operation mode, the sensing speed of the sense amplifier can be very fast.

However, the noise immunity of the conventional sense amplifier is very poor. Any low-going noise on the bitline node 5 can trigger the sense amplifier. This is due to the fact that the gate-source voltage of the n-channel transistor M6 is just at the edge of the threshold voltage.

As a solution to the noise immunity problem, the sense amplifier with an additional precharge circuit has been disclosed in U.S. Pat. No. 5,495,191, as shown in FIG. 2. Referring to FIG. 2, compared with the above-mentioned sense amplifier shown in FIG. 1, the sense amplifier described in U.S. Pat. No. 5,495,191 further comprises a noise margin circuit 7 coupled to the bitline node 5 and controlled by the precharge signal 6. The noise margin circuit 7 includes a p-channel transistor M15, an n-channel transistor M16, and an inverter INV3 as an additional precharge path. The inverter INV3 is preferably different from the inverter INV0 such that the voltage at a reference node NR1 is higher than the voltage at the reference node NR when the identical bitline voltage is used as the input to both inverters INV0 and INV3. In this manner, the n-channel transistor M16 remains on for a while after the n-channel transistor M6 switches off, and the bitline node 5, therefore, is charged higher to provide a noise margin.

However, the conventional sense amplifier disclosed in U.S. Pat. No. 5,495,191 has two disadvantages. On one hand, due to the arrangement of the noise margin circuit 7, the sense amplifier disclosed in U.S. Pat. No. 5,495,191 occupies an larger area on a semiconductor wafer resulting in the decrease of semiconductor device integration. On the other hand, the inverters INV0 and INV3 both consume static power if the bitline node 5 is not pulled down to ground. Therefore, the static power dissipation is significantly large.

SUMMARY OF THE INVENTION

In view of the disadvantages of the conventional single-ended sense amplifier, it is therefore an object of the present invention to provide a novel single-ended sense amplifier in which the noise margin is improved through using fewer circuit elements, thereby maximizing the integration degree on the semiconductor wafer.

It is another object of the present invention to provide a novel single-ended noise margin circuit, thereby providing an adjustable noise margin and reducing the static power consumption.

It is still another object of the present invention to provide a novel single-ended sense amplifier in which a power down control circuit is provided, thereby further reducing the static power consumption.

According to the present invention, a single-ended sense amplifier comprises an output circuit having an output terminal for indicating a state of a bitline in a read-only memory. A precharge circuit is coupled to an input terminal of the output circuit for charging the input terminal in response to a lower voltage level of a precharge signal. In addition, a noise margin circuit is coupled to the bitline node for outputting a reference voltage by inverting the voltage of the bitline node. Moreover, an n-channel transistor has a gate electrode coupled to receive the reference voltage for coupling the input terminal of the output circuit to the bitline node when the reference voltage exceeds a threshold voltage of the n-channel transistor.

The noise margin circuit has a larger logic-threshold voltage in response to the lower voltage level of the precharge signal and a smaller logic-threshold voltage in response to a higher voltage level of the precharge signal. The difference between the two logic-threshold voltages represents a possible noise margin.

Furthermore, the single-ended sense transistor according to the present invention comprises a power down control circuit coupled to the bitline node for reducing the static power consumption.

BRIEF DESCRIPTION OF THE DRAWINGS

The above and other objects, features, and advantages of the present invention will become more apparent from the following detailed description of embodiments taken in conjunction with the accompanying drawings, wherein.

DETAILED DESCRIPTION OF THE PREFERRED EMBODIMENTS

Figure 3:
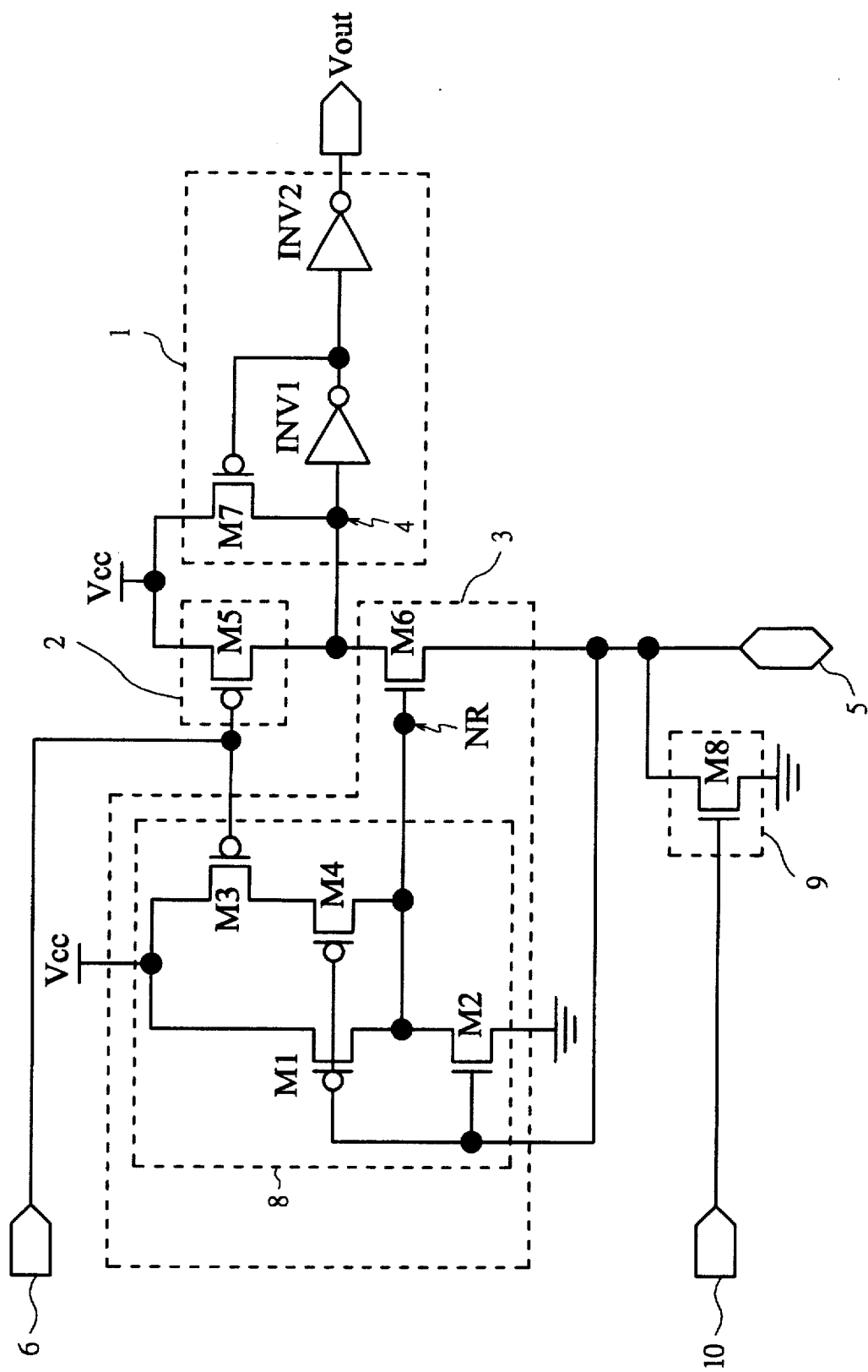
FIG. 3 is a circuit diagram showing a single-ended sense amplifier according to the present invention.

The preferred embodiment according to the present invention will now be described in detail with reference to FIGS. 3 to 4. Referring to FIG. 3, a single-ended sense amplifier includes an output circuit 1, a precharge circuit 2, and a discharge circuit 3. The output circuit 1 has a data node 4 as the input terminal. The data node 4 is coupled to the precharge circuit 2 and the discharge circuit 3.

Figure 1:
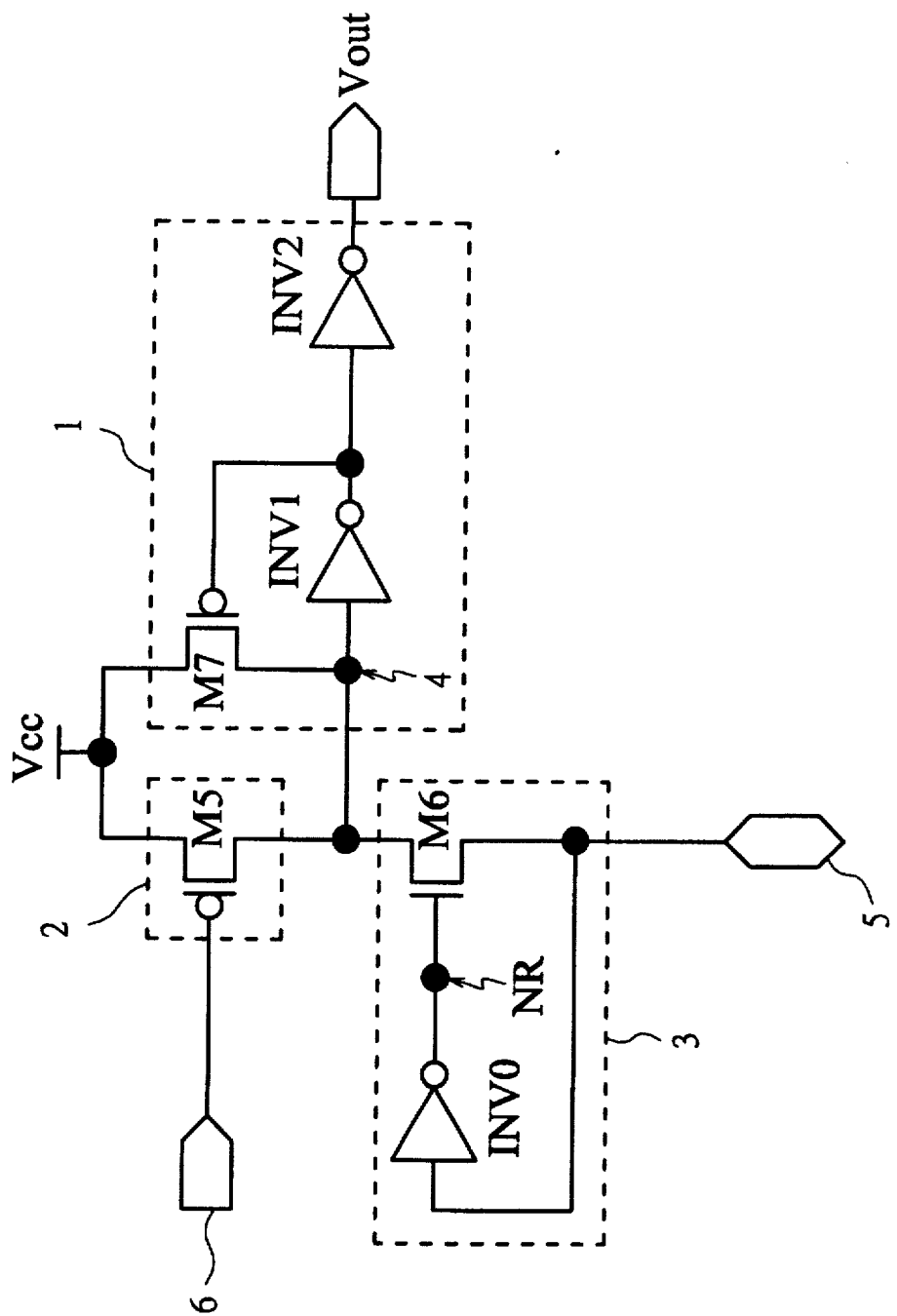
FIG. 1 is a circuit diagram showing a conventional single-ended sense amplifier for sensing a state of a bitline.
Figure 2:
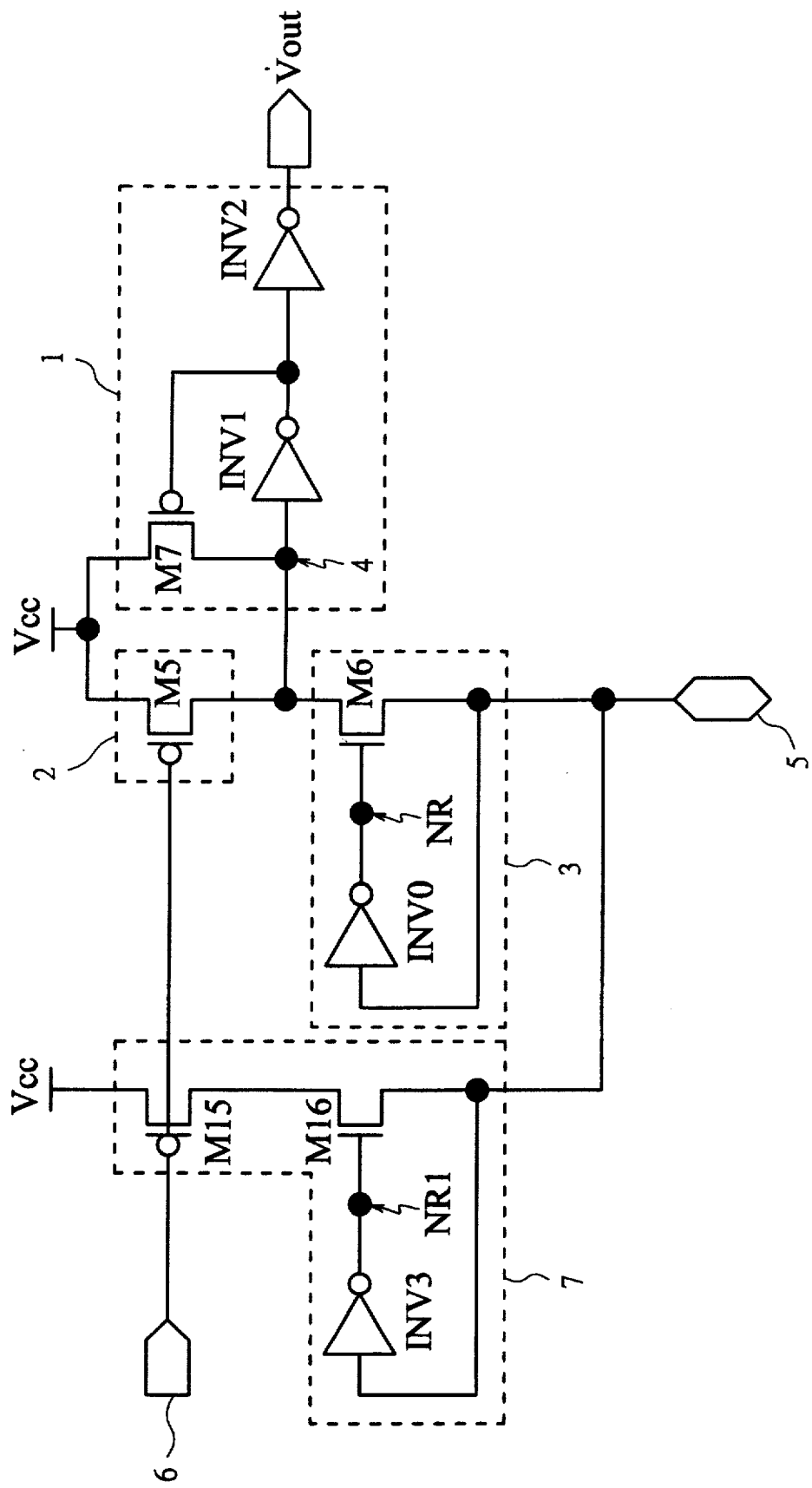
FIG. 2 is a circuit diagram showing another conventional single-ended sense amplifier for sensing a state of a bitline.

It should be noted that the precharge circuit 2 and the output circuit 1 according to the present invention are the same as the corresponding circuits of the conventional sense amplifiers shown in FIGS. 1 and 2. Therefore, the reference numerals and symbols used in FIG. 3 are similar with those in FIGS. 1 and 2 for the precharge circuit 2 and the output circuit 1. For simplicity, the detailed descriptions about the precharge circuit 2 and the output circuit 1 are hereby omitted.

As shown in FIG. 3, the discharge circuit 3 includes an n-channel transistor M6 and a noise margin circuit 8. The noise margin circuit 8 has its input terminal coupled to the bitline node 5 and its output terminal coupled to the gate electrode of the n-channel transistor M6 at a reference node NR.

The noise margin circuit 8 consists of three p-channel transistors M1, M3, and M4 and one n-channel transistor M2. The p-channel transistor M1 has a source electrode coupled to an external constant voltage source Vcc, a drain electrode coupled to the reference node NR, and a gate electrode coupled to the bitline node 5. The n-channel transistor M2 has a drain electrode coupled tot he reference node NR, a grounded source electrode, and a gate electrode coupled to the bitline node 5. The p-channel transistor M4 has a source electrode, a drain electrode coupled to the reference node NR, and a gate electrode coupled to the bitline node 5. The p-channel transistor M3 has a source electrode coupled to the external constant voltage source Vcc, a drain electrode coupled to the source electrode of the p-channel transistor M4, and a gate electrode for receiving a precharge signal 6.

Figure 4:
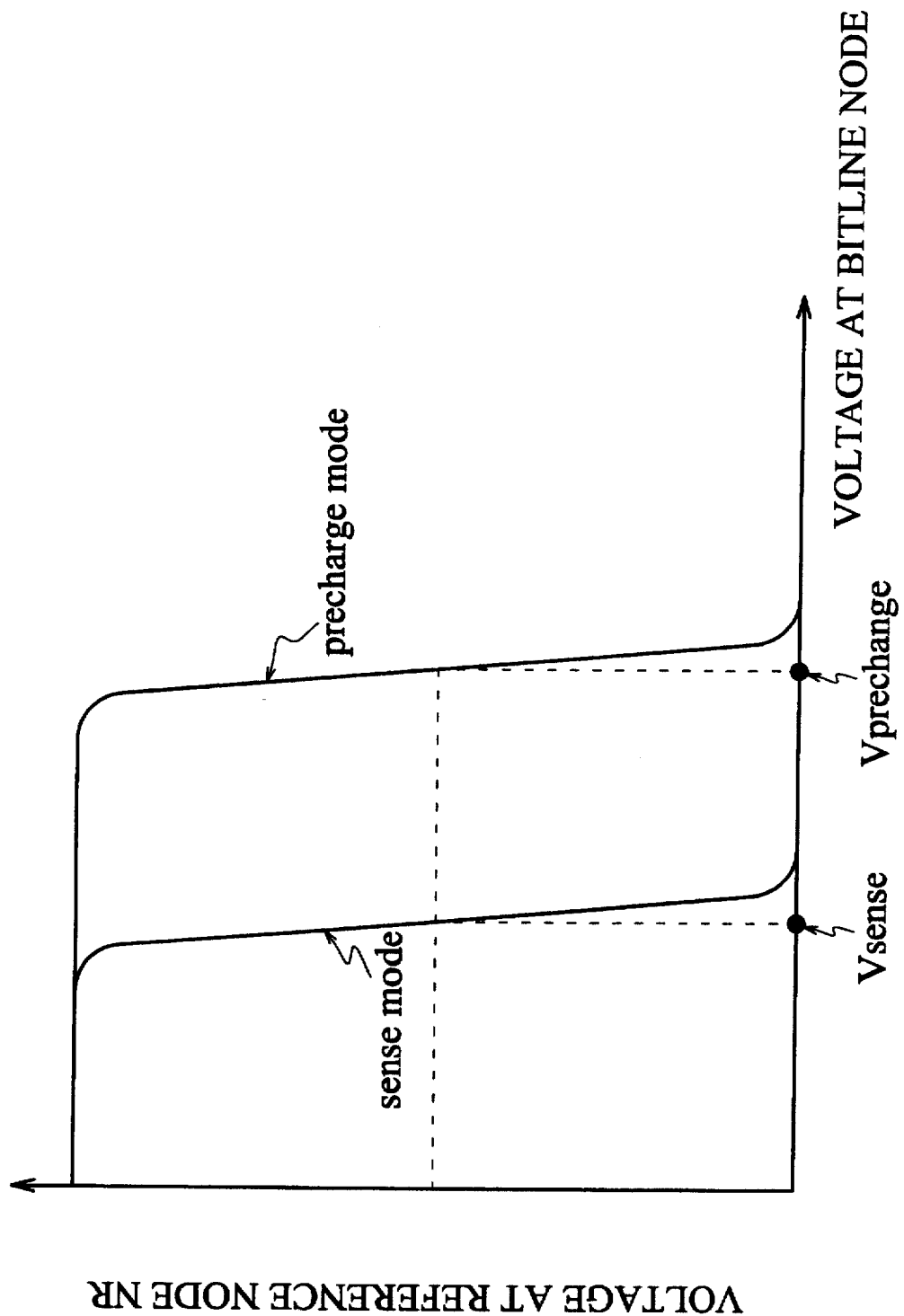
FIG. 4 is a graph showing the voltage transfer characteristic of a variable logic-threshold inverter according to the present invention.

Referring to FIG. 4, the voltage relationship between the bitline node 5 and the reference node NR is depicted during operations of the sense mode and the precharge mode of the single-ended sense amplifier. In FIG. 4, the abscissa indicates the voltage at the bitline node 5, while the ordinate indicates the voltage at the reference node NR>During the sense mode, the precharge signal 6 is high to turn the p-channel transistors M# and M4 off. As a result, the bitline node 5 is coupled to the reference node NR through, in effect, an CMOS (Complementary MOS) inverter consisting of the p-channel transistor M1 and the n-channel transistor M2 with a logic-threshold voltage $V_{sense}$. However, during the precharge mode, the precharge signal 6 is low to turn the p-channel transistors M3 and M4 on. As a result, the bitline node 5 is coupled to the reference node NR through, in effect, another CMOS inverter consisting of three p-channel transistors M1, M3, and M4 and one n-channel transistor M2 with a logic-threshold voltage $V_{precharge}$. As shown in FIG. 4, the logic-threshold voltage $V_{sense}$ is lower than the logic-threshold voltage Vprecharge. This is because the p-channel transistors M3 and M4 add a precharge path to the reference node NR. During the precharge mode, the additional precharge path allows the reference node NR to be precharged to a higher voltage level However, during the sense mode, the transistor M3 is turned off by the high voltage level of the precharge signal 6, resulting in a lower voltage at the reference node NR. Therefore, as shown in FIG. 4, the voltage transfer curve of the noise margin circuit 8 is shifted to the left when the operation mode changes from the precharge mode to the sense mode. In other words, the logic-threshold voltage of the noise margin circuit 8 formed by the transistors M1, M2, M3, and M4 is decreased from $V_{precharge}$ to $V_{sense}$ when the operation mode changes from the precharge mode to the sense mode.

In the present invention, the difference between the logic-threshold voltages $V_{precharge}$ and $V_{sense}$ represents the possible noise margin since the n-channel transistor M6 is operated in a deeper cut-off region during the sense mode due to the decrease of the voltage at reference node NR. As a result, the noise margin of the single-ended sense amplifier is increased as compared with the conventional sense amplifier shown in FIG. 1. Moreover, depending on an intended application, a suitable noise margin can be provided by adjusting the difference between the two logic-threshold voltages $V_{sense}$ and $V_{precharge}$.

Compared with the conventional single-ended sense amplifier shown in FIG. 2, the single-ended sense amplifier according to the present invention uses a fewer circuit devices and therefore occupies a smaller area on the semiconductor wafer. Furthermore, because the single-ended sense amplifier according to the present invention has only one variable logic-threshold inverter 8, the static power dissipation is lower.

In addition, the present invention provides a power down control circuit 9 including an n-channel transistor M8 for further reducing the static power dissipation of the single-ended sense amplifier, as shown in FIG. 3. The n-channel transistor M8 has a drain electrode coupled to the bitline node 5, a gate electrode for receiving a power-down signal 10, and a grounded source electrode. In order to reduce the power dissipation, an external control circuit (not shown) pulls high the precharge signal 6 to turn off the p-channel transistor M5. At this moment, the power-down signal 10 with a low voltage level is inputted to the gate electrode of the n-channel transistor M8. As a result of the conductive state of the n-channel transistor M8 in response to the power down signal 10, the voltage level at the bitline node 5 is pulled low. Since the reference node NR is coupled to the bitline node 5 through the noise margin circuit 8 the decrease of the voltage level at the bitline node 5 causes the increase of the voltage level at the reference node NR so as to turn on the n-channel transistor M6. As a consequence, the voltage level at the data node 4 is pulled down. The single-ended sense amplifier according to the present invention have no static current path under this condition, thereby improving the power consumption.

Accordingly, a novel single-ended sense amplifier with adjustable noise margin and power down control has been proposed. It provides higher noise immunity as compared with the conventional sense amplifier shown in FIG. 1. It occupies a smaller silicon area and consumes less power as compared with an alternative single-ended sense amplifier depicted in FIG. 2.

While the invention has been described by way of example and in terms of the preferred embodiment, it is to be understood that the invention is not limited to the disclosed embodiment. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A single-ended sense amplifier for sensing a state of a first node, comprising:

an output circuit having an input terminal and an output terminal, the output terminal indicating a state of the first node in response to a voltage level of the first node;

a precharge circuit coupled to the input terminal for charging the input terminal in response to a first voltage level of a precharge signal;

a noise margin circuit coupled to the first node for outputting a reference voltage by inverting the voltage level of the first node according to a first logic-threshold voltage in response to the first voltage level of the precharge signal and a second logic-threshold voltage in response to a second voltage level of the precharge signal; and a first n-channel transistor having a drain coupled to the input terminal of said output circuit, a source coupled to the first node, and a gate for receiving the reference voltage, and characterized in that said noise margin circuit comprises:

a first p-channel transistor having a source coupled to an external voltage source, a drain coupled to the gate of said first n-channel transistor, and a gate coupled to the first node;

a second n-channel transistor having a drain coupled to the gate of said first n-channel transistor, a grounded source, and a gate coupled to the first node;

a second p-channel transistor having a source, a drain coupled to the gate of said first n-channel transistor, and a gate coupled to the first node; and a third p-channel transistor having a source coupled to the external voltage source, a drain coupled to the source of said second p-channel transistor, and a gate for receiving the precharge signal;

wherein an inverter with the second logic-threshold voltage substantially consisting of said first p-channel transistor and said second n-channel transistor is effectively operated in response to the second voltage level of the precharge signal being higher than the first voltage level of the precharge signal by turning said second p-channel transistor and said third p-channel transistor off, and an inverter with the first logic-threshold voltage substantially consisting of said first p-channel transistor, said second n-channel transistor, said second p-channel transistor, and said third p-channel transistor is effectively operated in response to the first voltage level of the precharge signal by turning said second p-channel transistor and said third p-channel transistor on, in such a way that first logic-threshold voltage of said noise margin circuit is higher than the second logic-threshold voltage of the noise margin circuit.

2. The sense amplifier of claim 1, further comprising a power down control circuit coupled to the first node for pulling down the voltage of the first node in response to a power-down signal.

3. The sense amplifier of claim 2 wherein said power down control circuit comprises a third n-channel transistor having a drain coupled to the first node, a gate for receiving the power-down signal, and a grounded source.

4. The sense amplifier of claim 1 wherein said output circuit comprises:

a first inverter coupled to an output node and the input terminal for sensing a state of the input terminal, respectively;

a fourth p-channel transistor having a source, a drain coupled to the input terminal of said output circuit, and a gate coupled to the output node of said first inverter; and a second inverter coupled to the output node of said first inverter and the output terminal of said output circuit, respectively.

5. The sense amplifier of claim 1 wherein said precharge circuit comprises a fifth p-channel transistor having a source coupled to an external voltage source, a drain coupled to the input terminal of said output circuit, and a gate for receiving the precharge signal.

6. The sense amplifier of claim 1 wherein the first node is a bitline node in a read-only memory.

7. The sense amplifier of claim 1 wherein the first node is a bitline node in a register file.

* * * * *